Dec. 8, 1959 E. L. DIX 2,916,674

PRINTED CIRCUIT SELECTOR SWITCH

Filed May 16, 1957 2 Sheets-Sheet 1

INVENTOR
EDGAR L. DIX

BY Richard C. Reed ATTORNEYS

PRINTED CIRCUIT SELECTOR SWITCH

Filed May 16, 1957 2 Sheets-Sheet 2

INVENTOR
EDGAR L. DIX

BY
Richard C. Reed
ATTORNEYS

United States Patent Office 2,916,674

Patented Dec. 8, 1959

2,916,674

PRINTED CIRCUIT SELECTOR SWITCH

Edgar L. Dix, Oxon Hill, Md.

Application May 16, 1957, Serial No. 659,736

3 Claims. (Cl. 317—112)

(Granted under Title 35, U.S. Code (1952), sec. 266)

The invention described herein may be manufactured and used by or for the Government of the United States of America for governmental purposes without the payment of any royalties thereon or therefor.

The present invention relates to selector contact switches and more particularly to a compact multiple contact printed circuit selector switch.

Circuits are defined as being "printed" when they are produced on an insulated surface by any process. Various methods of printing circuits may be used, such as, painting, spraying, chemical deposition, vacuum process, die stamping, dusting, etching or by photographic means.

Multiple contact switches have been used for distributing a plurality of selected electrical voltages in distribution panels of various types and more generally for the transformation of electrical input signals into a selectively equal or unequal number of electrical output signals.

The device of the present invention is basically a "sandwich" of three copper-clad plastic boards or any other suitable insulating material on which suitable conductive patterns have been formed by some suitable method such as etching. This new switch can be used where it is necessary to interchange a number of signal leads and by using permanently connected inputs and outputs the signals can be interchanged from one circuit to another for appropriate switching of electrical signals.

It is therefore an object of the present invention to provide a simple switch for interchanging a number of signals.

Another object is to provide a switch means for changing electrical input signals into a selective equal or unequal number of properly directed output signals.

Still another object of the present invention is to provide a simple selector switch which can be easily assembled, requires minimum space and minimum manufacturing cost.

Other objects and features of the present invention will become apparent to those skilled in the art as the disclosure is made in the following detailed description of a preferred embodiment of the invention as illustrated in the accompanying drawings in which;

Fig. 2 is an end view of the selector switch illustrating the relative parts,

The present invention comprises basically the equivalent of two multi-pole switches adapted for selective switching and positoned with one section of the switch above the other as in a sandwich. Each section of the switch is formed by elongated contact strips positioned at right angles to each other such that a contacting member slidable along the entire length of one strip will alternately contact any of the other contact strips to complete a circuit with the strip that is contacted. Separate contact strips of one section are connected serially with the outputs of the other section such that the slidable members of one section will connect the outputs of one section to the outputs of the other section in order to transfer the output from one switch section to the selective outputs of the other section.

Figures 1A, 1B, 4:
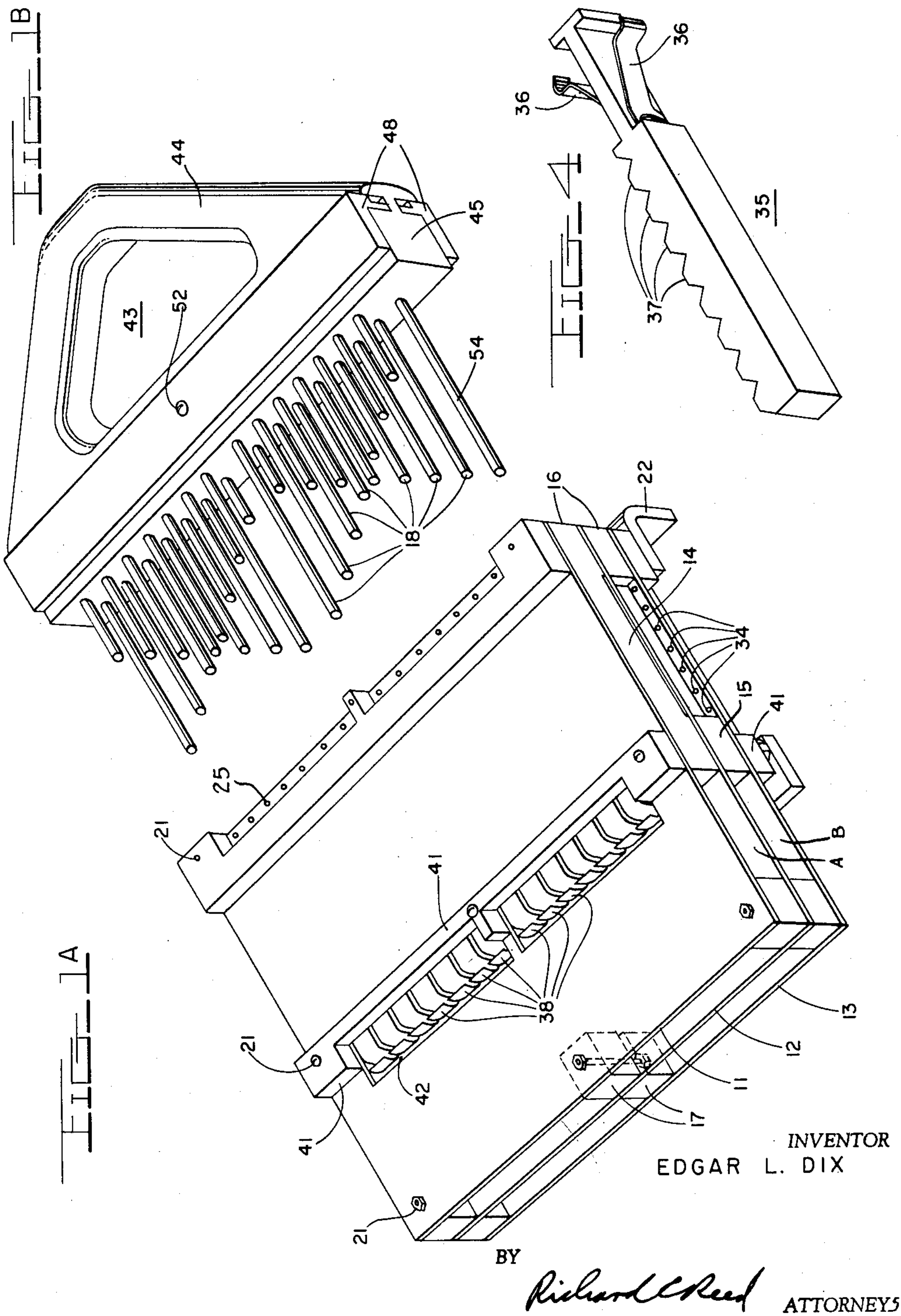
Fig. 1A is a perspective front view of the selector switch.
Fig. 1B illustrates a side view of the switch loading mechanism.
Fig. 4 is a view illustrating in detail the contact members of the switch.
Figure 3:
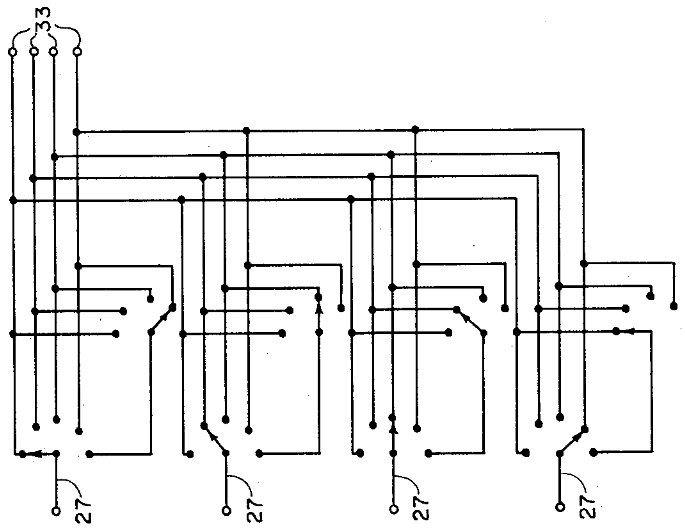
Fig. 3 is a simple electrical circuit diagram illustrating a switch having four inputs and four selected outputs.
Figure 4:
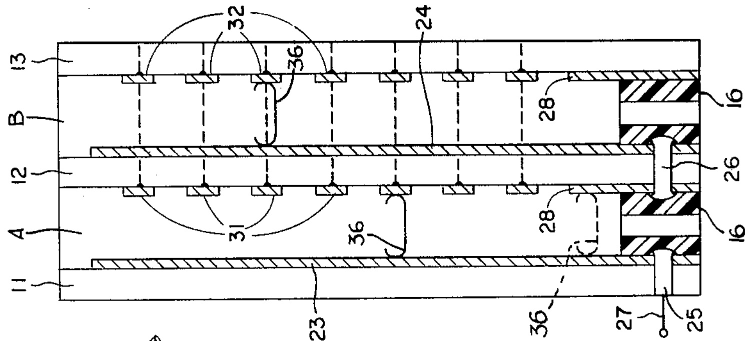

Referring now to the drawings, wherein like reference characters refer to like parts throughout, there is shown by illustration in Fig. 1 a perspective front view of the device of the present invention which by illustration shows a switch having two sections, which any number may be used. As shown the device comprises three plates or sheets 11, 12, and 13 of insulating material such as plastic separated from each other at the ends thereof by plastic blocks 14 and 15 or any other insulating material, and on the back by blocks 16, with a small piece of plastic 17 separating the plates on the front to provide two switch sections A and B. Blocks 16 have aligned holes along the length thereof for reception of loading pins 18 which will be described in more detail later. The plates are held together by suitable pins 21 which pass through the plastic separators and the switch is provided with a mounting plate 22 connected to the bottom surface by the pins 21 to provide means for the purpose of securing the switch to any desired structure.

The bottom surface of plates 11 and 12 have a multiple number of elongated output conductive strips 23 and 24 such as copper formed thereon which extend along the width of the switch sections anud connect respectively to output terminals 25 and 26. Terminals 25 connect with output leads 27 to various circuits whereas terminals 26 in the form of eyelets through plate 12 connect with short contact strips 28 on the top surface of plate 12, the short strips provide means for transferring signals from the output strips of switch section "B" to the output terminals of section "A" when the movable contacts of section "A" are in their unloaded position, as shown by dotted line in Fig. 2.

The upper surfaces of plates 12 and 13 have a multiple number (same as for the lower sides of 11 and 12) of elongated input conductive strips 31 and 32 which extend along the length of the switch sections at right angles to output strips 23 and 24 and connect with input leads 33 at terminals 34. The terminals are formed with eyelets through the plates that connect with the input strips and the end of the switch is so constructed that the input leads could be connected with the terminals by spring loaded contacts which slide in between the two plates and contact with the eyelets.

Circuits through the switch are completed by slidable contact members 35 positioned between the input and output conductive strips and slide along the output strip to make contact with any desired input conductive strip. The contact members (shown in Fig. 4) are made of an insulating material to which spring metal contacts 36 have been secured and are electrically connected to each other through the contact member. The slidable members have notches 37 cut across one surface thereof within which spring holders 38 fit into to hold the slidable members in a selected position with their contacts in their preselected position.

The spring holders 38 are secured to the upper surface of plate 11 and to the bottom surface of plate 13 by any suitable means such as metal strips 41 across the length of the switch. A slot 42 is provided in the plates 11 and 13 to permit the spring holders to contact the notches 37 of the slidable contact members in order to hold the members in contacting position between their respective output strip and the selected input.

In order to use the switch, the contacts 36 of slidable contact member 35 must be positioned according to a preselected circuit arrangement. For this purpose, a switch loading mechanism 43, having a handle 44 and a base 45 which is adapted to secure thereto a multiple number of plungers 18 is used. Plungers 18 are arranged in holes linearly spaced along the base of mechanism 43 in accordance with the number needed for the circuit arrangement desired. The plungers are formed with a slot or groove 47 near one end thereof for reception of a holding plate 48 which has grooves 51 therein that allows the plate to fit over the plungers and into the slots, to hold the plungers within their respective hole along the base. Plates 48 are secured to the base by any suitable means such as screws 52, an extra plunger 54 is secured to the loading mechanism at one end thereof which matches with a guide in the switch for the purpose of allowing the switch to be properly loaded by receiving the loading mechanism in only one position.

Figure 6:
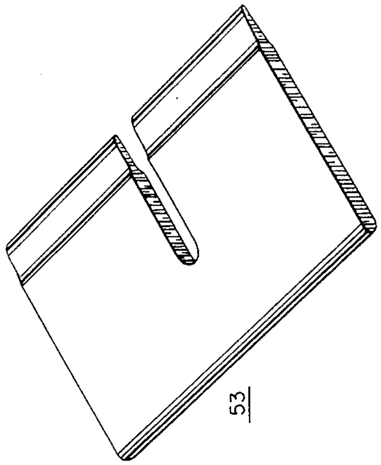
Fig. 6 illustrates a device for unloading the switch sections.
Figure 5:
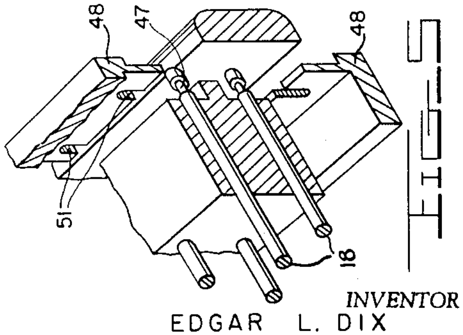
Fig. 5 is a view illustrating the relationship between the pins and the pin holding plates.

The switch may be made with any suitable number of input and output strips and the loading mechanism set up with the desired number of plungers for each section of the switch. In operation of the switch device, the plungers of the loading device are arranged in a selected manner then the plungers of the loading device are inserted into the holes in spacer 16 along the back of the switch and in accordance to the lengths of the plungers, the contact members 35 will be moved along the output strips of each section to position contacts 36 in contact with a particular input strip according to the desired preselected position. On positioning the contact members in a particular position, the spring holders 38 will fall into a groove 37 and hold the contact member in that particular position. After the loading mechanism has been inserted into the switch and properly positioned contacts 36 in their desired position, the switch loading mechanism is removed and the pins 18 are left as is, or they can be rearranged for another setting for another switch or for the same switch after it has been unloaded. Loading the illustrated switch having two sections as shown will control two different circuits for one common output. Loading the switch completes the circuit for the contacts of section A and arranges the contacts of section B for future use. The electrical circuits through section B are completed only by unloading section A by moving the contact members to their normal unloaded position. Contacts 36 in section A then completes the circuit between the output terminals of section B and the output terminals of section A through the contact members 36 of section A. When the circuit of section B is no longer needed, the arranged contacts of section B are unloaded to move the contact members back to their nomal unloaded position. Any suitable unloading means may be used to force the contact members back to their unloaded position, however a device such as shown in Fig. 6 may be used. The device 53 is made of a flat piece of hard insulating material having approximately the thickness of the contact members and appropriately slotted to pass the spacers 17 provided along the side.

Although the arrangement of the above two section switches has been described for use with two prearranged switch circuits for one common output, the present switch arrangement is not to be limited to this arrangement since it is obvious that any one skilled in the art could leave out the short contact strips and connect each section of the switch to independent output lines to different devices. For instance thirteen conducting strips formed in each section along the length of the switch to represent the alphabet can provide different words for a sign arranged for display purposes. By selectively moving the contacts over the contact strips of different letters, different words can be displayed and any number of sections can be provided along the length thereof to provide different words.

Obviously many modifications and variations of the present invention are possible in the light of the above teachings. It is therefore to be understood that within the scope of the appended claims the invention may be practiced otherwise than as specifically described.

What is claimed is:

1. A multiple contact printed circuit switch comprising first and second switch sections, each of said switch sections comprising an equal number of elongated conductive output and input strips positioned at right angles to each other, movable contact members in each section adapted to be selectively positioned between and simultaneously in contact with an output strip and any of said input strips within the respective switch section, and separate contacts in said first section connected to the terminals of the output strips of said second section whereby the circuits of said second switch section are completed through said first section to the output terminals of said first section.

2. A multiple contact printed circuit switch as claimed in claim 1 which includes means adapted for selectively positioning said movable contacts between said output strips and said input strips to complete desired circuits through said switch.

3. A multiple contact printed circuit switch as claimed in claim 2 including means adapted to move said contact members from their selective positions respectively to open circuit positions.

References Cited in the file of this patent

UNITED STATES PATENTS

| | | |
|---|---|---|
| 229,672 | Chinnock | July 6, 1880 |
| 243,274 | Lane | June 21, 1881 |
| 424,995 | Owen | Apr. 8, 1890 |
| 663,367 | Shore | Dec. 4, 1900 |
| 746,624 | Wood | Dec. 8, 1903 |
| 947,956 | Agutter | Feb. 1, 1910 |
| 1,283,563 | Roberts | Nov. 5, 1918 |